United States Patent
Hidalgo et al.

(10) Patent No.: US 7,423,259 B2
(45) Date of Patent: Sep. 9, 2008

(54) MASS SPECTROMETER AND METHOD FOR ENHANCING DYNAMIC RANGE

(75) Inventors: August Jon Hidalgo, San Francisco, CA (US); John Christian Fjeldsted, Redwood City, CA (US); William Daniel Frazer, Mountain View, CA (US); Carl Alan Myerholtz, San Jose, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 325 days.

(21) Appl. No.: 11/412,562

(22) Filed: Apr. 27, 2006

(65) Prior Publication Data
US 2007/0268171 A1 Nov. 22, 2007

(51) Int. Cl.
*B01D 59/44* (2006.01)
*H01J 49/00* (2006.01)
(52) U.S. Cl. .................. 250/281; 250/282; 250/286; 250/287; 250/291; 250/299; 250/214.1; 250/214 R; 250/214 A; 341/145; 341/155; 356/415; 356/215; 702/85

(58) Field of Classification Search .................. 250/281, 250/282, 286, 287, 291, 299, 214.1, 214 R, 250/214 A; 341/145, 155; 356/415, 215; 702/85
See application file for complete search history.

(56) References Cited

U.S. PATENT DOCUMENTS

| 6,433,713 | B1 | 8/2002 | Fuhrman | |
|---|---|---|---|---|
| 6,653,626 | B2 | 11/2003 | Fischer et al. | |
| 6,680,476 | B1 * | 1/2004 | Hidalgo et al. | 250/286 |
| 6,744,044 | B2 * | 6/2004 | Hidalgo et al. | 250/287 |
| 6,778,125 | B1 | 8/2004 | Stewart et al. | |
| 6,822,227 | B1 * | 11/2004 | Hidalgo et al. | 250/287 |
| 6,878,931 | B1 | 4/2005 | Roushall et al. | |
| 2003/0173514 | A1 * | 9/2003 | Syage et al. | 250/287 |
| 2003/0218129 | A1 | 11/2003 | Rather | |

* cited by examiner

*Primary Examiner*—Jack I. Berman
*Assistant Examiner*—Meenakshi S Sahu (57) ABSTRACT

A mass spectrometer comprises an ion detector, a first amplifier, a second amplifier, and a spectra combiner. The ion detector is configured to generate an analog signal indicative of ions detected by the ion detector. The first amplifier is configured to amplify the analog signal to provide a first amplified signal having a first gain relative to the analog signal. The second amplifier is configured to amplify the analog signal to provide a second amplified signal having a second gain relative to the analog signal, and the first gain is different than the second gain. The spectra combiner is configured to combine first summed digital samples of the first amplified signal with second summed digital samples of the second amplified signal.

17 Claims, 5 Drawing Sheets

MASS SPECTROMETER AND METHOD FOR ENHANCING DYNAMIC RANGE

RELATED ART

In time-of-flight mass spectrometers (TOFMS), a mass sample to be analyzed is ionized, accelerated in a vacuum through a known potential, and then the arrival time of the different ionized components is measured at a detector. The larger the particle, the longer the flight time; the relationship between the flight time and the mass, m, can be written in the form:

$$\text{time} = k\sqrt{m} + c$$

where k is a constant related to flight path and ion energy, c is a small delay time, which may be introduced by the signal cable and/or detection electronics. When the term "mass" is used herein in the context of mass spectrometry of ions, it usually is understood to mean "mass-to-charge ratio."

An ion detector converts ion impacts into electrons. The signal generated by the detector at any given time is proportional to the number of electrons. There is only a statistical correlation between one ion hitting the detector and the number of electrons generated. In addition, more than one ion at a time may hit the detector due to ion abundance.

The mass spectrum generated by the spectrometer is the summed output of the detector as a function of the time-of-flight between the ion source and the detector.

The number of electrons leaving the detector in a given time interval is converted to a voltage that is digitized by an analog-to-digital converter (A/D).

A mass spectrum is a graph of the output of the detector as a function of the time taken by the ions to reach the detector. In general, a short pulse of ions from an ion source is accelerated through a known voltage. Upon leaving the accelerator, the ions are bunched together but travelling at different speeds. The time required for each ion to reach the detector depends on its speed, which in turn, depends on its mass. Consequently, the original bunch is separated in space into discrete packets, each packet containing ions of a single mass, that reach the detector at different times.

A mass spectrum is generated by measuring the output of the A/D converter as a function of the time after the ions have been accelerated. The range of delay times is divided into discrete "bins." Unfortunately, the statistical accuracy obtained from the ions that are available in a single packet is insufficient. In addition, there are a number of sources of noise in the system that result in detector output even in the absence of an ion striking the detector. Hence, the measurement is repeated a number of times ("multiple scans") and the individual mass spectra are summed to provide a final result having the desired statistical accuracy and signal-to-noise ratio.

The dynamic range of a mass spectrometer generally refers to the range of possible output values for its ion detector. Increasing the dynamic range generally improves the signal-to-noise ratio of the detector's output. Indeed, if the dynamic range is not sufficiently high, some small pulses in the detector's output may be undetectable. Unfortunately, the dynamic range of the detector's output is often limited by the output capacity of the A/D converter.

SUMMARY OF THE DISCLOSURE

Generally, embodiments of the present disclosure provide mass spectrometers and methods for enhancing dynamic range.

A mass spectrometer in accordance with one exemplary embodiment of the present disclosure comprises an ion detector, a first amplifier, a second amplifier, and a spectra combiner. The ion detector is configured to generate an analog signal indicative of ions detected by the ion detector. The first amplifier is configured to amplify the analog signal to provide a first amplified signal having a first gain relative to the analog signal. The second amplifier is configured to amplify the analog signal to provide a second amplified signal having a second gain relative to the analog signal, and the first gain is different than the second gain. The spectra combiner is configured to combine first summed digital samples of the first amplified signal with second summed digital samples of the second amplified signal.

A method in accordance with another exemplary embodiment of the present disclosure comprises: generating an analog signal indicative of detected ions; amplifying the analog signal to provide a first amplified signal having a first gain relative to the analog signal; amplifying the analog signal to provide a second amplified signal having a second gain relative to the analog signal, the first gain different than the second gain; summing digital samples of the first amplified signal to produce first summed digital samples defining a first mass spectrum; summing digital samples of the second amplified signal to produce second summed digital samples defining a second mass spectrum; and combining the first and second summed digital samples into combined digital samples defining a third mass spectrum.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally relates to mass spectrometers and methods for providing digital samples indicative of mass spectra. A mass spectrometer in accordance with one exemplary embodiment of the present disclosure utilizes an ion detector and at least two amplifiers, a low gain amplifier and a high gain amplifier. Both the low and high gain amplifiers receive, from the ion detector, an analog signal indicative of the number of ions presently detected by the ion detector. The low gain amplifier applies a relatively low gain to the analog signal as compared to the gain applied by the high gain amplifier.

The analog signal from the ion detector as a function of time usually exhibits peaks that can be identified as originating from ions of specific masses. In the case of a time-of-flight mass spectrometer, the signal due to ions of a particular mass is from a packet or pulse of ions of that mass, spread over a small duration of time and separate from packets of ions of other masses. That signal is a peak herein called a "pulse."

The outputs of the low and high gain amplifiers are separately digitized by analog-to-digital (A/D) converters. Smaller pulses in the analog signal, due to the relatively high gain of the high gain amplifier, are better detected in the output of the high gain amplifier as compared to the output of the low gain amplifier. However, depending on the amplifier's gain and peak voltages of the analog signal, larger pulses in the output of the high gain amplifier may be clipped due to saturation of the A/D converter that is digitizing such output.

The digitized samples from successive scans (measurement repetitions) are separately summed in memory to define a low gain mass spectrum and a high gain mass spectrum. A spectra combiner combines summed digital samples of the low gain mass spectrum with summed digital samples of the high gain mass spectrum. In combining such digital samples, the spectra combiner substitutes digital samples defining the clipped peaks of the high gain mass spectrum with calibrated digital samples defining the corresponding peaks of the low gain mass spectrum. Moreover, by enabling multiple A/D converters to define different portions of the resulting mass spectrum, the dynamic range of the ion detector's output can be increased.

Figure 1:
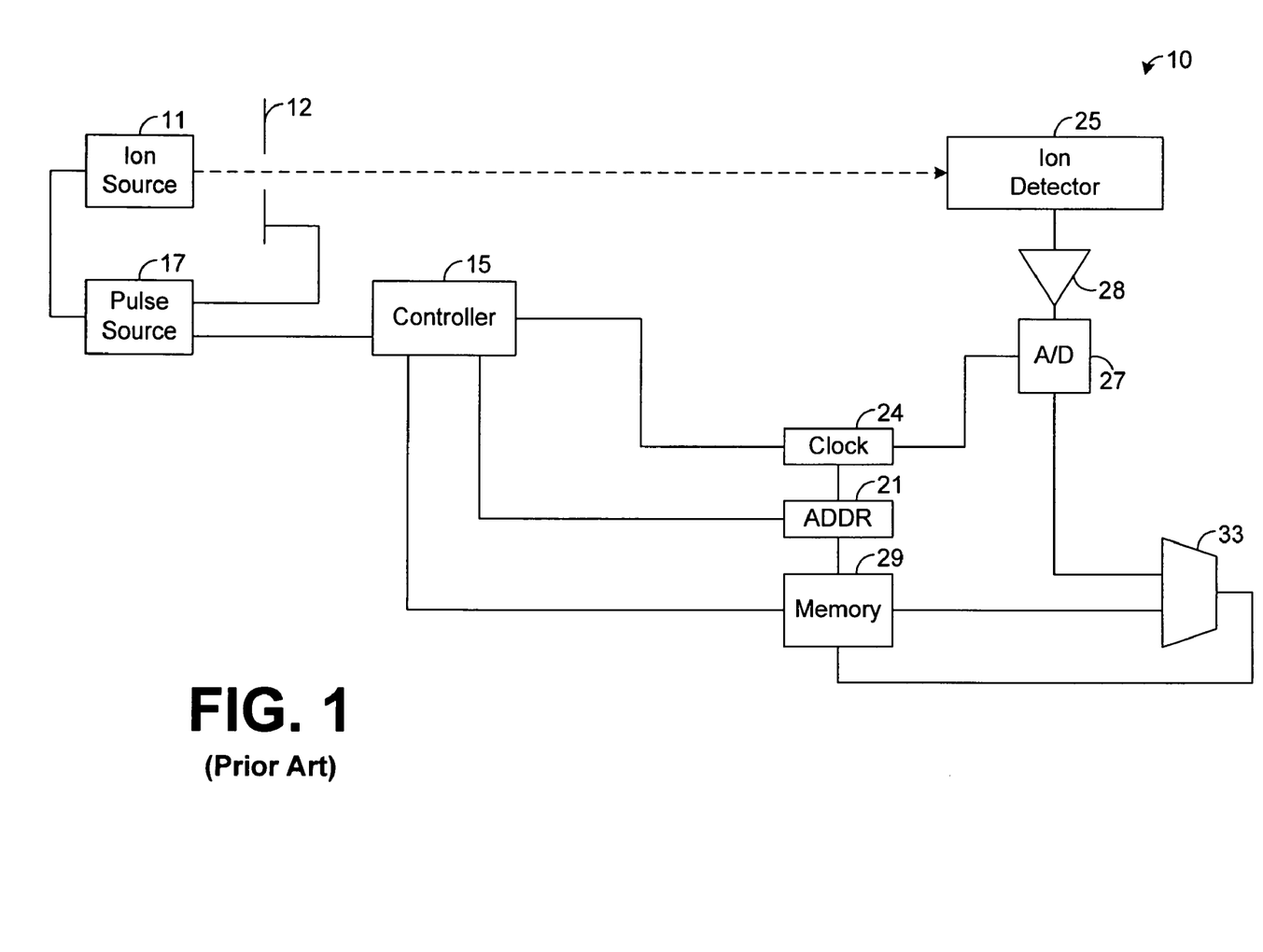
FIG. 1 is a block diagram illustrating a conventional mass spectrometer.

FIG. 1 illustrates a conventional time-of-flight mass spectrometer 10. A mass sample to be analyzed is introduced into an ion source 11 that ionizes the sample. The ions so produced are accelerated by applying a potential between the ion source 11 and an electrode 12. At the beginning of each mass scan, a controller 15 causes a short pulse to be applied between the electrode 12 and ion source 11 by sending the appropriate control signal to a pulse source 17. The controller 15 also resets the contents of a write address register 21. On subsequent clock cycles, the address register 21 is incremented by a signal from a clock 24, and an analog signal generated by an ion detector 25 is digitized by an analog-to-digital converter (A/D) 27 after being amplified by an amplifier 28. The value stored in memory 29 at the address specified in the address register 21 is applied to an adder 33, which adds the stored value to the value provided by A/D converter 27. The summed value is then stored back in memory 29 at the address in question.

As noted above, the time required by an ion to traverse the distance between the electrode 12 and the detector 25 is a measure of the mass of the ion. This time is proportional to the value in address register 21 when the ion strikes the detector 25. Hence, memory 29 stores data that can be used to generate a graph of the number of ions with a given mass as a function of the mass. In other words, the data stored in memory 29 defines a mass spectrum of the sample being analyzed.

Various devices, such as a Faraday cup, multichannel plate (MCP), electron multiplier (continuous structure as well as dynode structure), conversion dynode, Daly detector, and combinations thereof, may be used to implement the ion detector 25. The signal generated by the ion detector 25 depends on the number of ions striking the detector 25 during the clock cycle in question. In general, this number is relatively small, and hence the statistical accuracy of the measurements obtained in any single mass scan is usually insufficient. In addition, there is a significant amount of noise in the system. The noise is generated both in the detector 25, analog path, and in the A/D converter 27.

To improve statistical accuracy, the data from a large number of mass scans are summed. At the beginning of the measurement process, the controller 15 stores zeros in all of the memory locations in memory 29 and initiates the first mass scan. When the first mass scan is completed, the controller 15 resets the address register 21 and initiates another mass scan by pulsing the electrode 12. The data from the second mass scan is added to that from the previous mass scan. This process is repeated until the desired statistical accuracy is obtained.

Unfortunately, the dynamic range of useable signals from the detector 25 is often limited by the output capacity of the A/D converter 27. In this regard, if the input dynamic range is too high, then the output capacity of the A/D converter 27 may be insufficient to correctly sample all of the pulses in the output of the detector 25. In particular, some large pulses may saturate the analog input of the A/D converter 27 and, therefore, may not be correctly represented by the sample values generated by the A/D converter 27.

Figure 2:
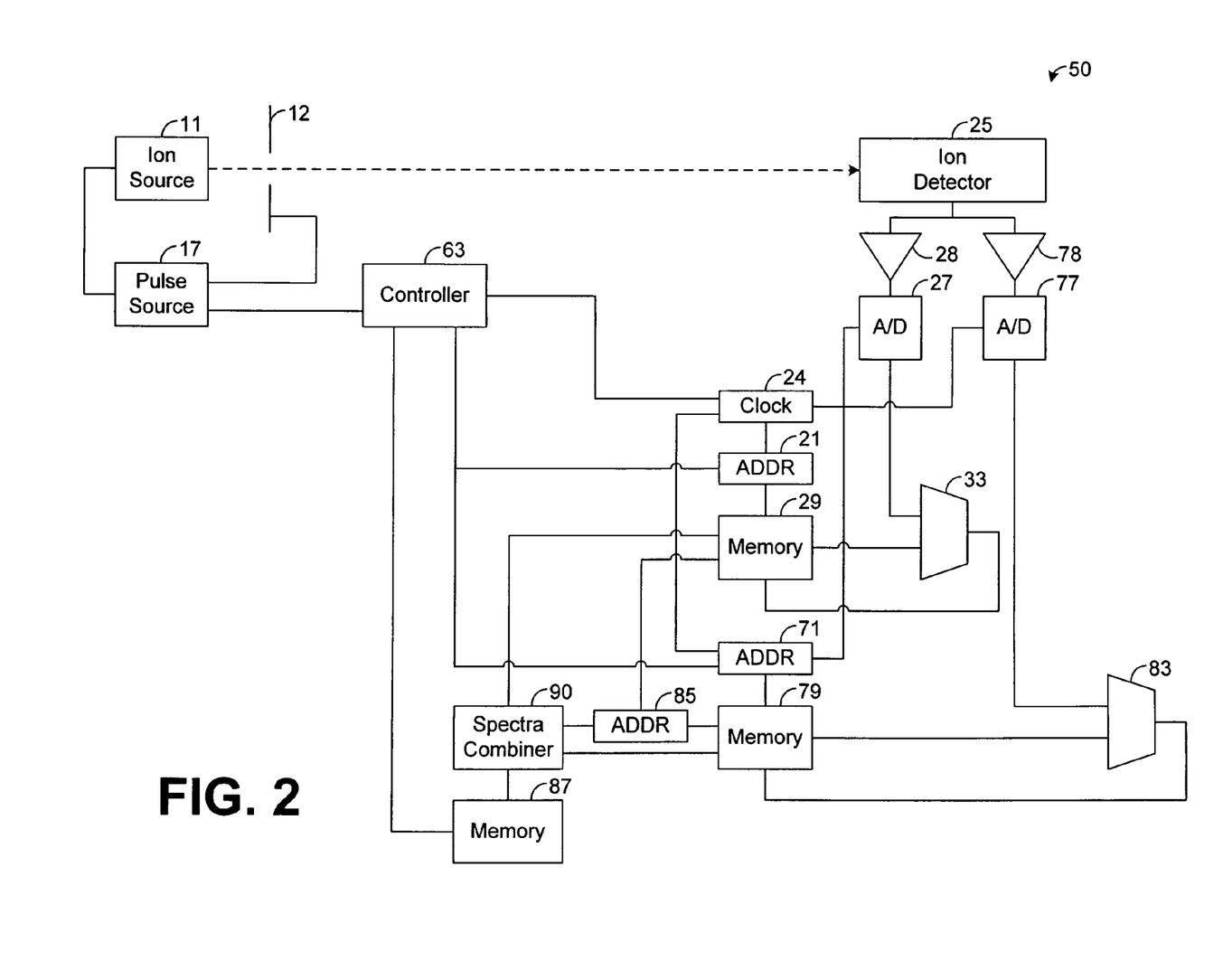
FIG. 2 is a block diagram illustrating a mass spectrometer in accordance with an exemplary embodiment of the present disclosure.

FIG. 2 depicts a time-of-flight mass spectrometer 50 in accordance with an exemplary embodiment of the present disclosure. To simplify the description of FIG. 2 and subsequent drawings, those elements that serve functions analogous to elements discussed above with reference to FIG. 1 have been given the same numeric designations.

As shown by FIG. 2, the mass spectrometer 50 comprises an ion source 11, a pulse source 17, a write address register 21, a clock 24, an ion detector 25, an A/D converter 27, an amplifier 28, memory 29, and an adder 33. These elements, operating under the direction and control of a controller 63, perform essentially the respective functions as the elements of the same reference numerals in FIG. 1. Thus, as described above with reference to FIG. 1, a mass sample to be analyzed is introduced into the ion source 11 that ionizes the mass sample. A pulse from the pulse source 17 causes the ions in the ion source 11 to be accelerated toward the ion detector 25, which detects the accelerated ions. The ion detector 25 outputs an analog signal indicative of the detected ions.

As in FIG. 1, the analog signal output by the detector 25 of FIG. 2 is amplified by the amplifier 28. The gain of the amplifier 28 is preferably set low enough to ensure that the pulses of the analog signal provided by the ion detector 25 are not clipped in the output of the A/D converter 27. In other words, the gain of the amplifier 28 is preferably set low enough such that none of the pulses of the analog signal cause the analog input of A/D converter 27 to saturate.

Thus, once the spectrometer 50 takes a measurement, which preferably includes a large number of mass scans, the memory 29 is storing measurement data as it does in the embodiment depicted by FIG. 1. Such measurement data define a mass spectrum, referred to herein as the "low gain mass spectrum," of the ionized sample.

In the embodiments described herein for which the write address register 21 is incremented for each clock cycle, each different address in memory 29 is storing a digital data value representing a sum of digital samples of the analog signal from the ion detector 25 for different mass scans. Further, contiguous memory addresses store samples that are consecutive in terms of time. For example, assuming that the address register 21 is four digits and is reset by the controller 63 at the beginning of a mass scan, as described herein, then the data value stored at address 0000 represents the sum of digital samples taken during the first clock cycle of each mass scan. The data value stored at address 0001 represents the sum of digital samples taken during the second clock cycle of each mass scan, the data value stored at address 0002 represents the sum of digital samples taken during the next clock cycle, and so on.

As shown by FIG. 2, the mass spectrometer 50, in addition to the elements described above, comprises a write address register 71, an A/D converter 77, an amplifier 78, memory 79, and an adder 83, which essentially perform the same functionality as the write address register 21, the A/D converter 27, the amplifier 28, the memory 29, and the adder 33, respectively. Therefore, the memory 79, like the memory 29, stores measurement data comprising a plurality of digital values representing summed samples of the analog signal from the ion detector 25 for different mass scans. Further, just as it does for the write address register 21, the controller 63 preferably resets the write address register 71 at the beginning of each mass scan, and the write address register 71 is incremented for each clock cycle. Thus, like the addresses in memory 29, each different address in memory 79 is storing a digital data value representing a sum of digital samples of the analog signal from the ion detector 25, and contiguous memory addresses store samples that are consecutive in terms of time.

For example, assuming that the address register 71 is four digits and is reset by the controller 63 at the beginning of a mass scan, as described herein, then the data value stored at address 0000 represents the sum of digital samples taken during the first clock cycle of each mass scan. The data value stored at address 0001 represents the sum of digital samples taken during the second clock cycle of each mass scan, the data value stored at address 0002 represents the sum of digital samples taken during the next clock cycle, and so on.

Note that the digital samples at the same address in memory 29 and 79 correspond to one another in terms of time. In particular, the digital values of the same address in memory 29 and 79 both represent a sum of samples taken at approximately the same time from the start of each mass scan. For instance, in the current example, the digital sample at the memory address 0000 in memory 29 represents the sum of the samples taken during the first clock cycle after the start of each mass scan. Similarly, the digital sample at the memory address 0000 in memory 79 represents the sum of the samples taken during the first clock cycle of each mass scan. However, the digital samples in memory 29 are based on the analog signal output by the amplifier 28, and the digital samples in memory 79 are based on the analog signal output by the amplifier 78. Moreover, the mass spectrum defined by the digital samples stored in memory 79 will be referred to hereafter as the "high gain mass spectrum."

Figure 3:
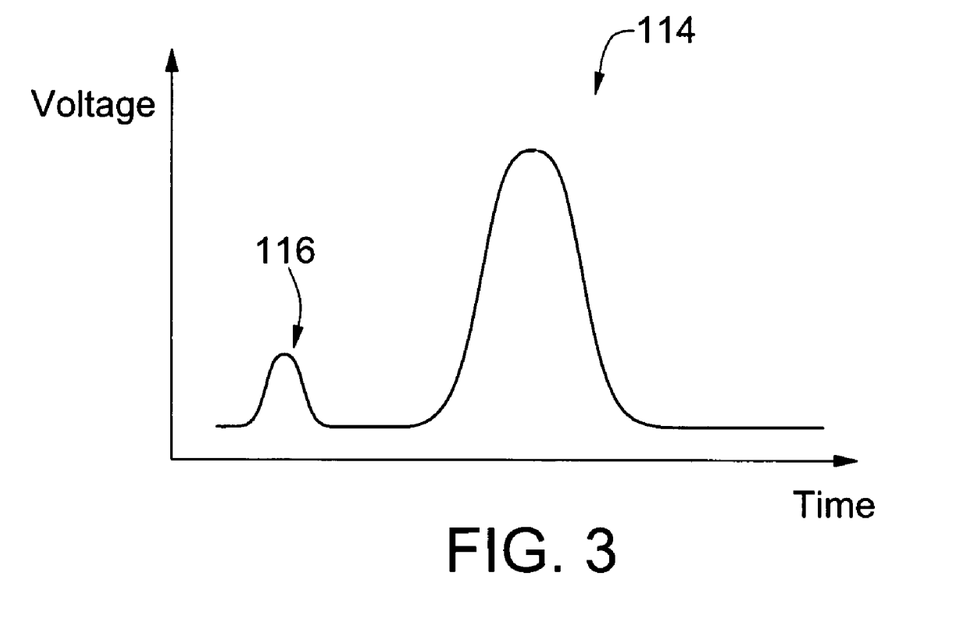
FIG. 3 is an illustration of an exemplary analog signal output from a high gain amplifier depicted in FIG. 2.

In addition, the gain of amplifier 78 is preferably different than the gain of amplifier 28. In particular, the gain of amplifier 78 is preferably higher than the gain of amplifier 28 so that pulses with smaller peaks in the analog signal from detector 25 are more pronounced in the signal output by the amplifier 78 as compared to the signal output by the amplifier 28. Thus, such small pulses can be better detected and analyzed in the signal output by the amplifier 78. As an example, FIG. 3 depicts an output of the amplifier 78, referred to hereafter as the "high gain amplifier," for an exemplary analog input signal from the ion detector 25. The signal of FIG. 3 has a small pulse 116 followed in time by a large pulse 114. The large pulse 114 indicates that a greater number of ions has been detected by the ion detector 25 during the time interval associated with the large pulse 114 as compared to the number of ions detected during the time interval associated with the small pulse 116. The pulses depicted in FIG. 3 are idealized. In practice, such signals will often contain noise and may not exhibit smooth curves as functions of time.

The high gain provided by amplifier 78 increases the size of the small pulse 116 thereby making the pulse 116 more noticeable and easier to detect. However, the high gain also increases the size of the large pulse 114. Such a gain may cause the large pulse 114 to be clipped by the sampling performed by the A/D converter 77. In particular, the large pulse 114 may saturate the analog input of the A/D converter 77 such that the digital samples of such pulse 114 output from the A/D converter 77 inaccurately represent the large pulse 114.

Figure 4:
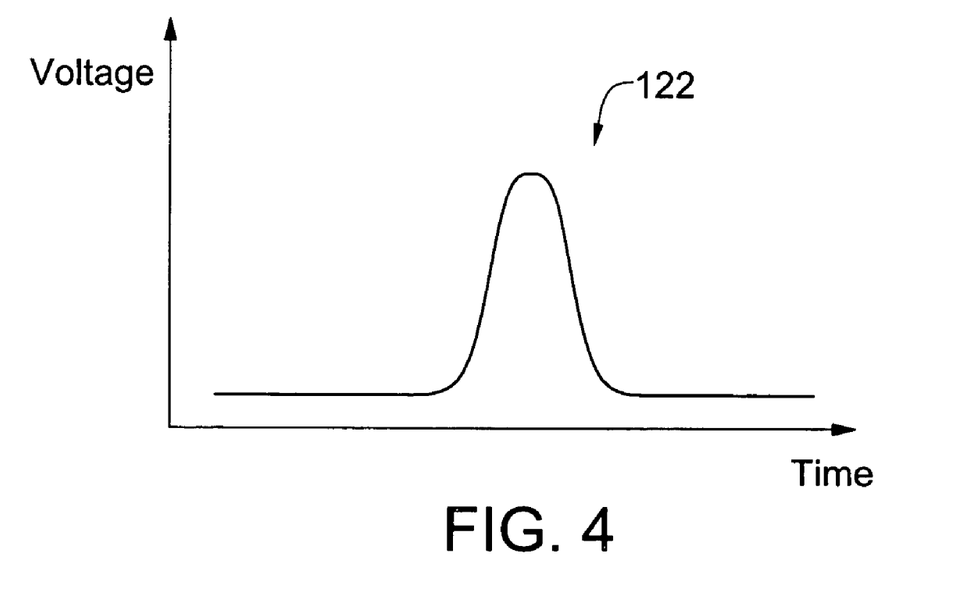
FIG. 4 is an illustration of an exemplary analog signal output from a low gain amplifier depicted in FIG. 2.

FIG. 4 depicts an output of amplifier 28, referred to hereafter as the "low gain amplifier," for the same analog input signal on which FIG. 3 is based. The gain of the amplifier 28 is preferably low enough such that a pulse 122 corresponding to the large pulse 114 of FIG. 3 is not clipped by the sampling performed by the A/D converter 27. However, the low gain of the amplifier 28 may be insufficient to generate a noticeable pulse corresponding to the small pulse 116 of FIG. 3. Note that a pulse in the output of the high gain amplifier 78 "corresponds" to a pulse in the output of the low gain amplifier 28 when both pulses are associated with the same time interval and are, therefore, based on the same pulse in the analog signal input to both of the amplifiers 28 and 78. As an example, the corresponding pulses 114 and 122 in FIGS. 3 and 4 both represent amplified versions of the same pulse in the analog signal output from the ion detector 25 and input to both of the amplifiers 28 and 78. Thus, the pulses 114 and 122 are indicative of the number of ions detected by the detector 25 during the same time interval.

Thus, the high gain of the amplifier 78 can enable small pulses to be better detected and analyzed but may result in the clipping of one or more large pulses by the A/D converter 77. On the other hand, the low gain of the amplifier 28 can prevent large pulses from being clipped but may make it more difficult to detect and analyze small pulses.

Figure 5:
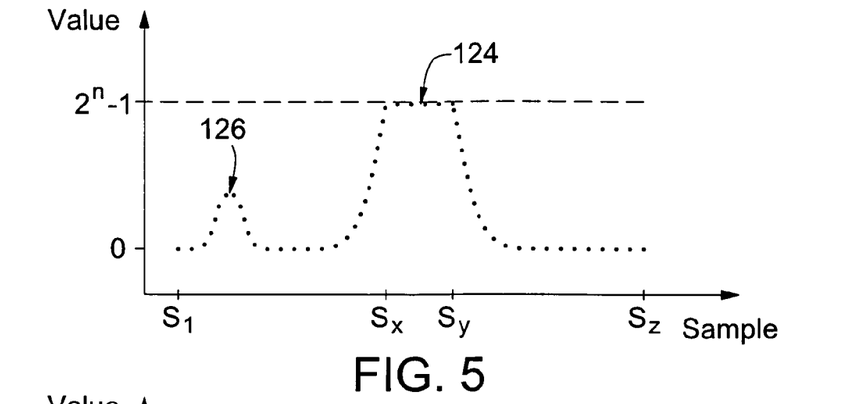
FIG. 5 is an illustration of an exemplary mass spectrum defined by summed digital samples of an output of the high gain amplifier depicted in FIG. 2.

For illustrative purposes, assume that both of the A/D converters 27 and 77 have n output bits such that each A/D converter is able to output $2^n$ different values. The high gain spectrum defined by the data stored in memory 79 may appear as shown by FIG. 5 for a single scan of z total samples, which are consecutive in terms of time. In this regard, the digital value of each sample depicted by FIG. 5 is stored in a different address in memory 79 and is associated with a different time interval relative to the other samples depicted by FIG. 5. The mass spectrum of the single scan has a large peak 124 and a small peak 126, and the large peak 124 is clipped from sample $S_x$ to sample $S_y$. In this regard, the values of such samples ideally would be above $2^n-1$. However, saturation at the analog input of the A/D converter 77 prevents these samples from being assigned higher digital values to accurately represent the peak 124.

Figure 6:
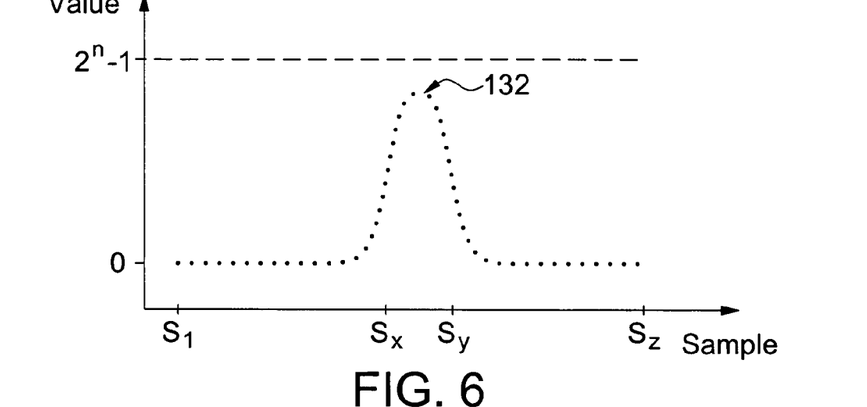
FIG. 6 is an illustration of an exemplary mass spectrum defined by summed digital samples of an output of the low gain amplifier depicted in FIG. 2.

FIG. 6 depicts an exemplary low gain mass spectrum defined by the data stored in memory 29 for the same single scan measurement that generated the data defining the spectrum of FIG. 5. The low gain spectrum has a large peak 132 corresponding to the large peak 124 of FIG. 5. Peaks are referred to herein as "corresponding" when such peaks are associated with the same time interval. Due to the low gain of amplifier 27, the mass spectrum of FIG. 6 does not have a noticeable peak corresponding to the small peak 126 of the mass spectrum of FIG. 5.

As shown by FIG. 2, the mass spectrometer 50 comprises a read address register 85, memory 87, and a spectra combiner 90. The spectra combiner 90 is configured to combine the digital samples in memory 29 with the digital samples in memory 79 to provide a set of digital samples defining a mass spectrum that represents a combination of the low gain mass spectrum and the high gain mass spectrum. Note that the spectra combiner 90 may be implemented in hardware, software, or a combination thereof. As an example, the spectra combiner 90 may be implemented in software and executed by a digital signal processor (DSP), a central processing unit (CPU), or other type of apparatus for executing the instructions of the spectra combiner 90. In other embodiments, the spectra combiner 90 can be implemented in firmware or hardware, such as logic gates, for example.

In at least one embodiment, the spectra combiner 90 analyzes the digital samples stored in memory 79. As described above, such samples are defined by summing samples of the analog signal output from the high gain amplifier 78 over multiple scans and will, therefore, be referred to hereafter as "high gain samples." Similarly, the digital samples stored in memory 29 are defined by summing samples of the analog signal output from the low gain amplifier 28 over multiple scans and will be referred to hereafter as "low gain samples."

In analyzing the high gain samples in memory 79, the spectra combiner 90 estimates which of the samples define a clipped portion of a mass spectrum peak. There are several methodologies that may be employed to identify the digital samples defining clipped portions of a peak. For example, in one embodiment, the spectra combiner 90 can first locate peaks within the data defined by the high gain samples. The front edge of a peak can be identified by locating a string of consecutive samples that increase in value indicating a positive slope, and the back edge of a peak can be identified by a string of samples that decrease in value indicating a negative slope.

For each identified peak, the spectra combiner 90 can then analyze the high gain samples defining the peak to determine whether the peak has been clipped. A clipped peak is usually defined by a relatively long string of samples at the same value (e.g., corresponding to the value of $2^n-1$ for a single scan). Thus, the differential of all of the samples defining a clipped portion of a peak is approximately zero (0). Therefore, the spectra combiner 90 can determine that a peak has been clipped when the differential of a string of at least a specified number of consecutive samples for the peak is approximately 0. Moreover, each sample within such a string of samples defines a clipped portion of the peak. Note that digital samples defining a clipped portion of a peak will be referred to herein as "clipped," and other samples will be referred to herein as "un-clipped."

Other techniques for detecting a clipped portion of a peak are possible. For example, a sample threshold may be specified such that any high gain sample having a value above the threshold is determined to be clipped. To prevent clipped samples from being mistakenly identified as un-clipped, a margin of error may be introduced by lowering the selected sample threshold such that any sample below the threshold is ensured, with a high degree of certainty, to be un-clipped. Note that factoring in such a margin of error may cause some un-clipped samples to be identified as clipped. However, as will be described in more detail below, such a misclassification is acceptable in many circumstances. Generally, lowering the sample threshold provides a higher degree of certainty that clipped samples will not be mistakenly identified as un-clipped but also increases the likelihood that more un-clipped samples will be mistakenly identified as clipped.

In other embodiments, various other techniques may be employed by the spectra combiner 90 to estimate which of the high gain samples are clipped.

After identifying the clipped high gain samples, the spectra combiner 90 combines the high gain samples with the low gain samples to provide a set of samples defining a mass spectrum of the ionized sample. In this regard, the spectrum combiner 90 uses the high gain samples to define such a signal. However, the spectra combiner 90 replaces the clipped high gain samples with corresponding low gain samples from memory 29, and the spectra combiner 90 stores the combined samples in memory 87.

For example, referring to FIG. 5 as applied to summed samples, to define a peak corresponding to the peak 124, the spectra combiner 90 uses the high gain samples from memory 79. However, the samples defining the portion of the peak 124 between samples $S_x$ and $S_y$ are clipped and are preferably identified as such by the spectra combiner 90. Thus, the spectra combiner 90 substitutes low gain samples from memory 29 for the clipped high gain samples between $S_x$ and $S_y$. In particular, in substituting for the clipped high gain samples (i.e., the samples between $S_x$ and $S_y$), the spectra combiner 90 uses the corresponding low gain samples defining the peak 132 of FIG. 6.

However, before replacing the clipped high gain samples with the corresponding low gain samples, the spectra combiner 90 calibrates the low gain samples to account for the gain difference between the amplifiers 28 and 29. In this regard, the spectra combiner 90 calibrates the low gain samples such that when these samples are used to replace the clipped high gain samples, the resulting peak is accurately represented by the calibrated low gain samples. The calibration can be achieved by multiplying each low gain sample by the ratio of the gains of the amplifiers 28 and 78. For example, if the gain of amplifier 78 is twice as large as the gain of amplifier 28, then the low gain samples may be calibrated by multiplying their values by two. In other embodiments, other techniques may be used to appropriately calibrate the low gain values.

Therefore, the resulting mass spectrum defined by the combined samples stored in memory 87 has small peaks defined by high gain samples and has large peaks defined, at least in part, by calibrated low gain samples. Accordingly, small peaks are more pronounced and better detected since they are defined by high gain samples, yet the large peaks corresponding to pulses that saturate the analog input of A/D converter 77 do not appear to be clipped.

Figure 7:
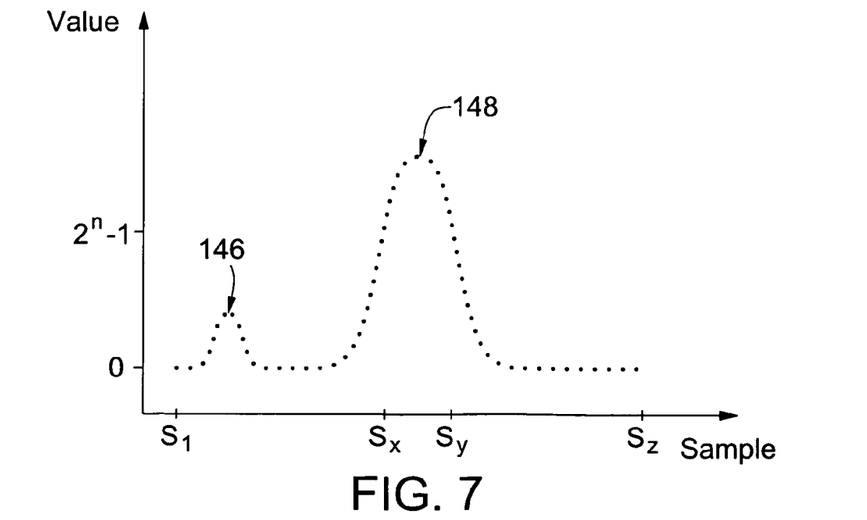
FIG. 7 is an illustration of an exemplary mass spectrum defined by digital samples combined by a spectra combiner depicted in FIG. 2.

As an example, in combining mass spectra similar to those shown for a single scan in FIGS. 5 and 6, the spectra combiner 90 preferably provides a set of digital samples defining a mass spectrum similar to that shown in FIG. 7. As shown by FIG. 7, the mass spectrum has a small peak 146 corresponding to peak 126 of FIG. 5 and a large peak 148 corresponding to peaks 124 and 132 of FIGS. 5 and 6. The small peak 146 is defined by the high gain samples that define the peak 126 of FIG. 5 and, therefore, appears the same as this peak 126. However, the large peak 148 is not clipped. In this regard, the samples between $S_x$ and $S_y$ of FIG. 7 are calibrated low gain samples from memory 29. The remainder of the samples defining peak 148 can be high gain samples from memory 79.

It is worth noting that the un-clipped portions of the peak 148 (i.e., the portions of peak 148 defined by samples before $S_x$ and after $S_y$) can be defined by low gain samples instead of high gain samples. Therefore, as described above, the algorithm for identifying clipped high gain samples can, without a significant adverse impact on performance, provide a margin of error to ensure that clipped high gain samples are not mistakenly identified as un-clipped. Indeed, if a sample threshold is used to identify clipped high gain samples as described above, then the sample threshold may be lower than the values of $S_x$ and $S_y$.

However, it is likely that the low gain samples may have a lower signal-to-noise ratio as compared to high gain samples. Thus, it is generally desirable to use, as much as possible, high gain samples to define the resulting spectrum. Accordingly, in the example described above in which a sample threshold is used to identify clipped high gain samples, it is desirable to set the threshold just low enough to ensure, with a desired degree of certainty, that clipped samples are not mistakenly identified as un-clipped.

In embodiments described above, the address registers 21 and 71 are simultaneously reset by the controller 63 and clocked by the clock 24 for each mass scan. Thus, a sample stored in memory 29 corresponds to the sample at the same address of memory 79. In this regard, the sample stored in memory 29 was taken during the same approximate time period (e.g., clock cycle) as the sample at the same address in memory 79 but is based on the output of low gain amplifier 28 instead of high gain amplifier 78. Exemplary techniques for combining the high gain samples with the low gain samples for such embodiments will be now be described in more detail with particular reference to FIG. 8.

Figure 8:
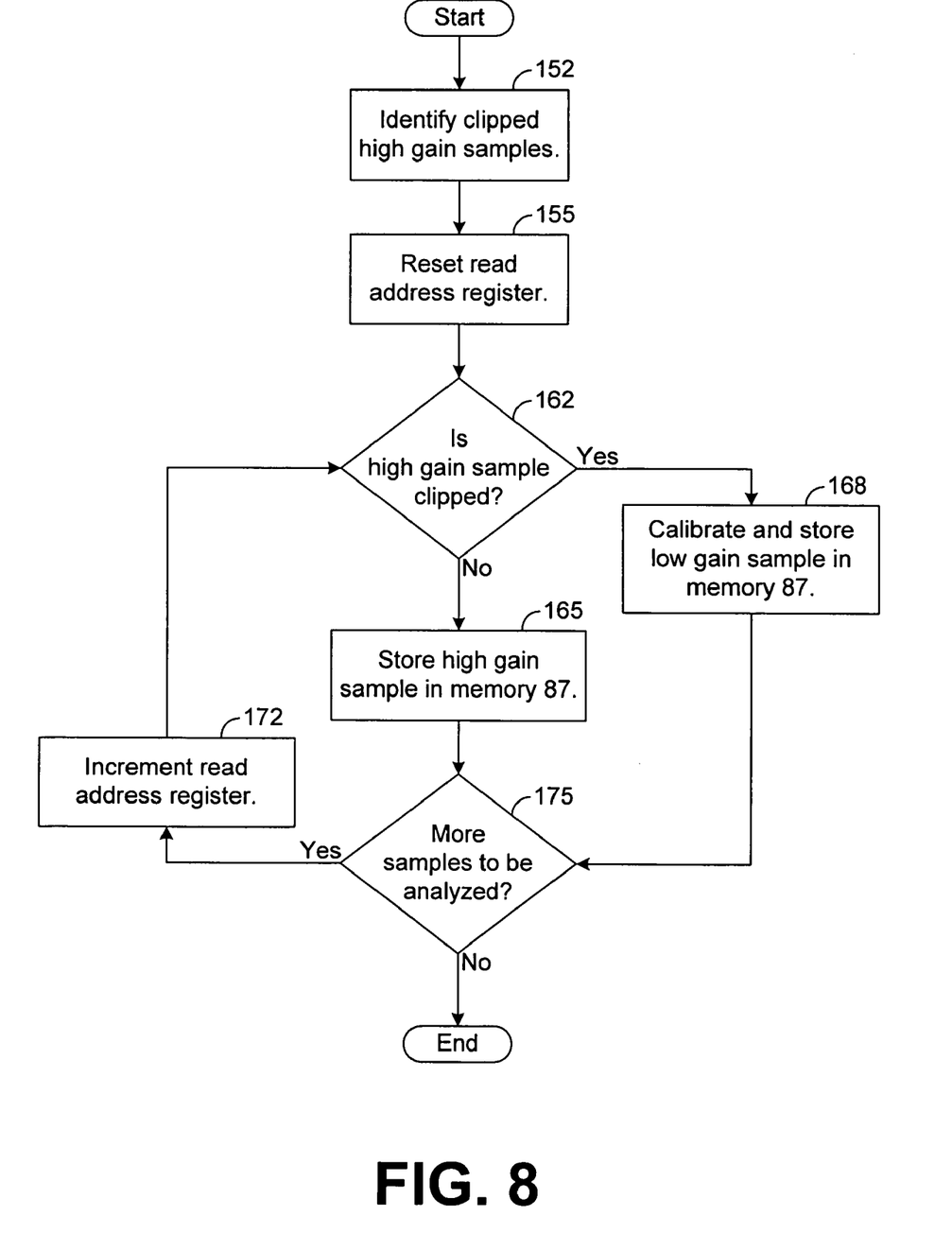
FIG. 8 is a flow chart illustrating an exemplary architecture and functionality of the spectra combiner depicted in FIG. 2.

As described above, the spectra combiner 90 analyzes the high gain samples stored in memory 79 to identify which of the samples are clipped, as indicated by block 152 of FIG. 8. As indicated by block 155, the spectra combiner 90 resets the read address register 85 such that this register 85 points to the address in memory 29 and 79 storing the first sample. As indicated by blocks 162 and 165, if the high gain sample stored at the address identified by the register 85 is indicated as un-clipped, then the spectra combiner 90 reads this high gain sample and stores this high gain sample in memory 87 as the first sample of the resulting spectrum. However, as indicated by blocks 162 and 168, if the foregoing high gain sample is instead indicated as clipped, then the spectra combiner 90 reads the corresponding low gain sample (i.e., the sample stored at the address identified by the register 85 in the current example), calibrates this low gain sample, and stores this low gain sample in memory 87 as the first sample of the resulting spectrum. The spectra combiner 90 then increments the address register 85, in block 172, and repeats the aforedescribed process.

In this regard, until a "no" determination is made in block 175, the spectra combiner 90 selects either the low gain sample or high gain sample at the address identified by the register 85 in memory 29 or 79 based on whether the high gain sample is indicated as clipped. The spectra combiner 90 then stores, in either block 165 or 168, the selected sample in memory 87 as the next sample defining the resulting signal. The aforedescribed process is repeated for each remaining high gain sample and corresponding low gain sample pair.

Thus, upon completion of the methodology depicted by FIG. 8, the memory 87 is storing digital samples defining a mass spectrum of the ionized sample that is being analyzed by the mass spectrometer 50. If desired, the digital samples in the memory 87 may be rendered to a display device (not shown) so that the mass spectrum of the ionized sample is displayed by the display device for analysis.

We claim:

1. A mass spectrometer, comprising:
   an ion detector configured to generate an analog signal indicative of ions detected by the ion detector;
   a first amplifier configured to amplify the analog signal to provide a first amplified signal having a first gain relative to the analog signal;
   a second amplifier configured to amplify the analog signal to provide a second amplified signal having a second gain relative to the analog signal, the first gain different than the second gain; and
   a spectra combiner configured to combine first summed digital samples of the first amplified signal with second summed digital samples of the second amplified signal.

2. The mass spectrometer of claim 1, wherein the spectra combiner is configured to determine whether at least one of the first summed digital samples defines a clipped peak of a mass spectrum that is defined by the first summed digital samples.

3. The mass spectrometer of claim 1, wherein the spectra combiner is configured to substitute at least one of the second summed digital samples for at least one of the first summed digital samples in response to a determination by the spectra combiner that the at least one first summed digital sample defines a clipped peak of a mass spectrum that is defined by the first summed digital samples.

4. The mass spectrometer of claim 1, wherein the spectra combiner is configured to calibrate at least one of the second summed digital samples based on the first and second gains.

5. The mass spectrometer of claim 1, wherein the first summed digital samples define a first mass spectrum having a clipped peak, and wherein the combined first and second summed digital samples define a second mass spectrum having an un-clipped peak corresponding to the clipped peak of the first mass spectrum.

6. The mass spectrometer of claim 5, wherein the spectra combiner is configured to ensure that at least a portion of the un-clipped peak of the second mass spectrum is defined by the second summed digital samples.

7. The mass spectrometer of claim 1, further comprising:
   a first adder configured to sum digital samples of the first amplified signal with previously stored digital samples to provide the first summed digital samples; and
   a second adder configured to sum digital samples of the second amplified signal with previously stored digital samples to provide the second summed digital samples.

8. The mass spectrometer of claim 7, further comprising:
   a first analog-to-digital converter coupled to the first adder and the first amplifier; and
   a second analog-to-digital converter coupled to the second adder and the second amplifier.

9. A mass spectrometer, comprising:
   an ion detector configured to generate an analog signal indicative of ions detected by the ion detector;
   a first amplifier configured to amplify the analog signal to provide a first amplified signal having a first gain relative to the analog signal;
   a second amplifier configured to amplify the analog signal to provide a second amplified signal having a second gain relative to the analog signal, the first gain different than the second gain; and
   a spectra combiner configured to combine summed digital samples of the first amplified signal with summed digital samples of the second amplified signal to provide combined digital samples defining a first mass spectrum, the first mass spectrum having an un-clipped peak corresponding to a clipped peak of a second mass spectrum defined by the summed digital samples of the first amplified signal.

10. The mass spectrometer of claim 9, wherein the spectra combiner is configured to calibrate the summed digital samples of the second amplified signal based on the first and second gains.

11. The mass spectrometer of claim 9, wherein the spectra combiner is configured to ensure that at least a portion of the un-clipped peak is defined by the summed digital samples of the second amplified signal.

12. The mass spectrometer of claim 11, wherein the spectra combiner is configured to select the summed digital samples of the second amplified signal for the un-clipped peak based on summed digital samples of the clipped peak.

13. A method for use in a mass spectrometer, comprising:
    detecting ions;
    generating an analog signal indicative of detected ions;
    amplifying the analog signal to provide a first amplified signal having a first gain relative to the analog signal;
    amplifying the analog signal to provide a second amplified signal having a second gain relative to the analog signal, the first gain different than the second gain;
    summing digital samples of the first amplified signal to produce first summed digital samples defining a first mass spectrum;
    summing digital samples of the second amplified signal to produce second summed digital samples defining a second mass spectrum; and
    combining the first and second summed digital samples into combined digital samples defining a third mass spectrum.

14. The method of claim 13, further comprising displaying information based on the combined digital samples.

15. The method of claim 13, further comprising calibrating the second summed digital samples based on the first and second gains.

16. The method of claim 13, wherein the combining comprises substituting a calibrated, un-clipped peak from the second mass spectrum for a clipped peak of the first mass spectrum.

17. The method of claim 13, further comprising:
    identifying a clipped peak in the first mass spectrum; and
    defining at least a portion of a peak in the third mass spectrum by a peak in the second summed digital samples corresponding to the clipped peak.

* * * * *